United States Patent [19]

Andersson et al.

[11] 4,015,118

[45] Mar. 29, 1977

[54] CONTROLLING THE AMPLIFICATION IN A RADIATION DETECTING AVALANCHE DIODE

[75] Inventors: Karl-Gustaf Leif Andersson; Klas Rudolf Wiklund, both of Taby, Sweden

[73] Assignee: AGA Aktiebolag, Lidingo, Sweden

[22] Filed: May 21, 1975

[21] Appl. No.: 579,369

[30] Foreign Application Priority Data

June 5, 1974 Sweden .............................. 74073891

[52] U.S. Cl. .............................. 250/211 J; 357/13
[51] Int. Cl.² ........................................ H01J 39/12
[58] Field of Search ............ 250/211 J; 357/13, 29, 357/30

[56] References Cited

UNITED STATES PATENTS

| | | | |
|---|---|---|---|
| 3,415,996 | 12/1968 | Grimmeiss | 250/211 J X |
| 3,452,206 | 6/1969 | Biet et al. | 357/30 X |
| 3,560,755 | 2/1971 | Blaise | 357/13 X |
| 3,571,630 | 3/1971 | Widlar | 357/13 X |
| 3,626,188 | 12/1971 | Chilton | 250/211 J X |

*Primary Examiner*—Alfred E. Smith
*Assistant Examiner*—David K. Moore
*Attorney, Agent, or Firm*—Lerner, David, Littenberg & Samuel

[57] ABSTRACT

A method and circuit for controlling the amplification in a radiation-detecting avalanche diode in which the diode generates electrical signals dependent upon the received radiation. These electrical signals are fed to evaluating means and a control signal is derived from the diode having a frequency which differs from the frequency used in the evaluation means. The amplitude of the control signal is compared with a preset value and the supply voltage of the diode is varied in dependence upon this comparison for controlling amplification of the diode.

3 Claims, 2 Drawing Figures

CONTROLLING THE AMPLIFICATION IN A RADIATION DETECTING AVALANCHE DIODE

BACKGROUND OF THE INVENTION

The present invention relates to a method for controlling the amplification in a radiation detecting avalanche diode in which the diode generates electrical signals depending on the received radiation, said signals being fed to evaluating means.

The term "photo avalanche diode" is used for radiation detecting avalanche diodes in spite of the fact that this does not mean only diodes detecting within the visible wavelength. The use of photo avalanche diodes has the disadvantage that the amplification of the diode at a constant voltage is very temperament dependent. This can also mean that the multiplication factor of the avalanche diode varies in accordance with the temperature.

This problem has been solved earlier with the aid of temperature compensation by means of a Zener-diode, placed in the same housing as, and thus having mainly the same temperature as, the photo avalanche diode. Such photo avalanche diodes with built-in Zener-diode are sold in the open market. As an example, the module TIXL 70, sold by Texas Instruments, operates within the visible as well as the infrared wavelength range.

SUMMARY OF THE INVENTION

The method according to the present invention comprises a simple and more flexible solution, i.e., since no special diodes with built-in references are necessary.

In accordance with the method of the present invention, the amplification in the photo avalanche diode is continuously controlled with the aid of a control signal generated from the diode with a frequency which differs from the frequencies of the information signal from the diode, said information signal being fed to an evaluating means.

In an embodiment of the present invention, the diode is fed not only with the radiation to be detected by the detector and then further evaluated, but also with a special radiation for creating the control signal. In another embodiment, the control signal is created from the diode noise.

The present invention is suitable for photo avalanche diodes used in different types of instruments, for instance, in electro-optical distance measuring instruments or in receivers for information, usually working primarily within the infrared, ultraviolet or visible wavelength range.

The characteristics of the invention will be evident from the enclosed patent claims.

DETAILED DESCRIPTION OF THE DRAWINGS

Figure 1:
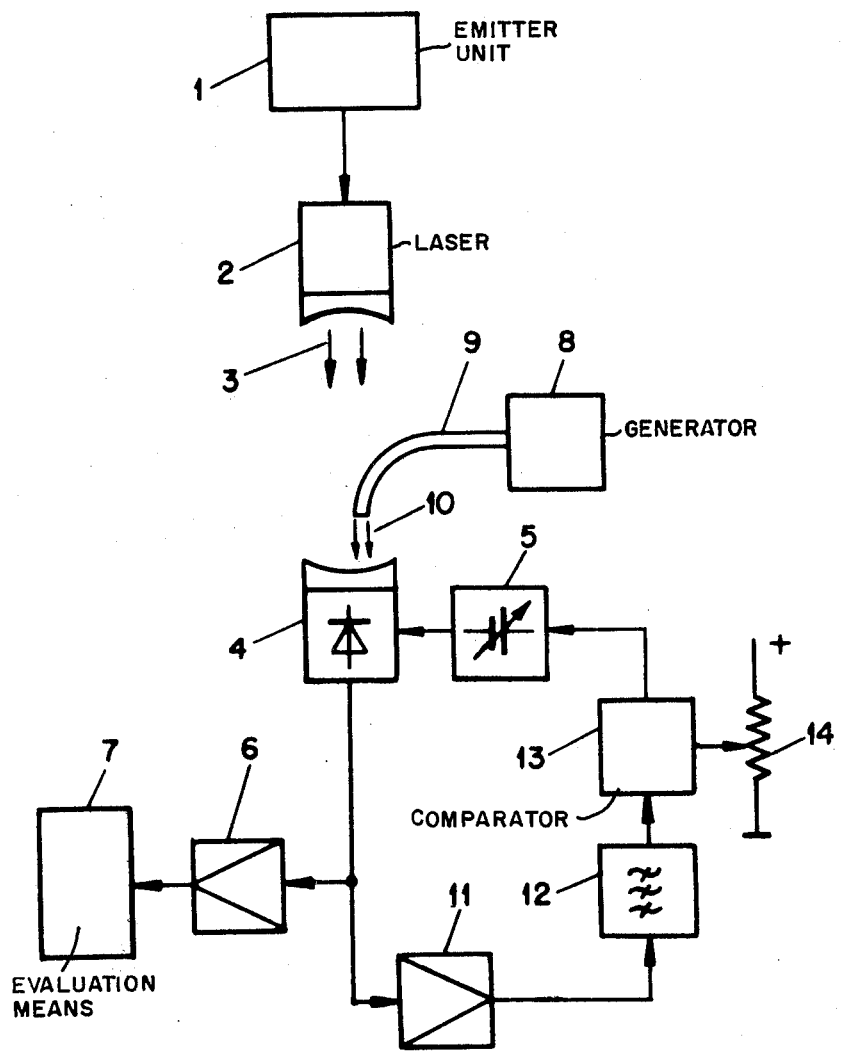

The present invention will be further described by means of the enclosed drawing, in which FIG. 1 shows an arrangement comprising an emitter and a receiver for transmitting information with the aid of laser radiation, the control signal being created with the aid of a certain kind of incident radiation on the detector.

Figure 2:
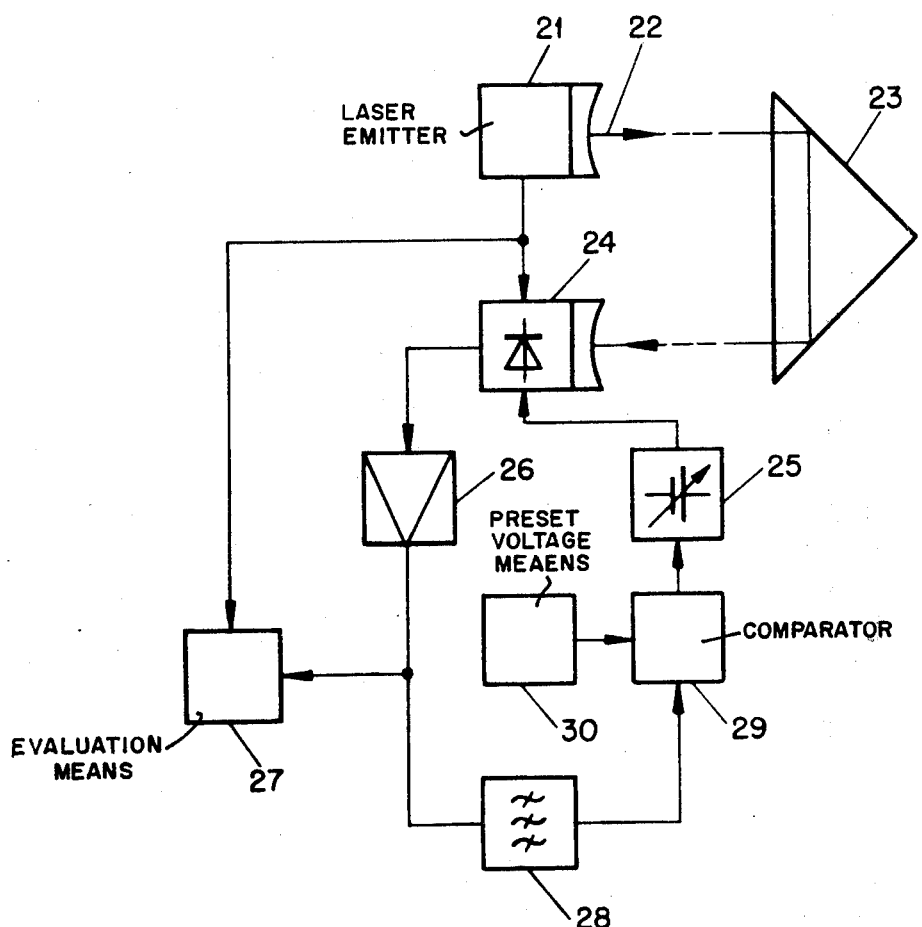

FIG. 2 shows an embodiment in which the control signal is generated from the diode noise and the diode is included in an electro-optical distance measuring instrument.

FIG. 1 shows an arrangment for transmitting information between an emitter and a receiver device. The emitter device comprises a unit 1, which will not be described in more detail. Said unit transmits signals to a laser emitter 2 for the modulation of the transmitted laser beam 3.

The receiver device comprises a receiving unit 4 having a detecting element in the form of a photo-avalanche diode. Said photo avalanche diode is fed with a supply voltage from an output voltage 5.

The information transmitted from the emitter device is now transformed into electrical signals and is transmitted from the detecting element 4 via an amplifying element 6 to evaluating means 7. Said means 7 transforms the signals into acoustic electrical or visual information and may transmit them to another emitter station for further transmission.

In such receiver devices 4, it is desirable to keep the amplification of the detector as constant as possible. The control of the amplification or the multiplication factor of the diode is obtained by varying the supply voltage of the diode.

The voltage source which generates the supply voltage to the diode is controlled by means of a control signal, generated by a control signal generator 8, preferably a laser or a light emitting diode, which emits a wavelength within the detection range of the diode. The radiation from generator 8 passes via a light conductor 9 towards the detector 4. The signal from detector 4 is also fed from the amplifier 11 to a bandpass filter 12. The filter 12 is adjusted to the frequency of the generator 8 and consequently only this frequency passes the filter. Block 7 may also comprise a detection arrangement for filtering away the frequency of the control signal.

The signal from generator 8 shall have an amplitude which is constant and known. The control signal is fed from filter 12 to a comparison circuit 13 in which the amplitude amplified by the detector is compared with a certain preset value. The preset value may be obtained from a voltage divider 14.

Depending on the comparison in block 13 a control signal is fed to the variable voltage source 5. The supply voltage of the photo avalanche diode will now vary so that the amplification of the diode is kept mainly constant.

The control signal $i_s$ from the photo avalanche diode could be written:

$$i_s = k_1 \cdot P_s \cdot M$$

where $P_s$ is the effect of the incident radiation in relation to the control signal, $M$ is the multiplication factor of the avalanche diode and $k_1$ is a constant. The system is now controlled so that the control signal $i_s$ is kept at a constant level determined by the preset value in the voltage divider 14. As mentioned above, the amplitude of the incident radiation $P_s$ is simultaneously kept constnat and the multiplication factor M will then be constant.

$$M = \frac{i_s}{k_1} \cdot \frac{1}{P_s} = \text{constant}$$

FIG. 2 shows an arrangement for carrying out the method according to the invention in a distance measuring opto-electrical instrument. The emitter 21 of the instrument comprises a radiation source, for instance, a laser, mercury lamp or light conductor for infrared or visible light, and a modulation signal source. The signal 22 from emitter 21 consists of modulated electro-magnetic waves. After reflection in a corner prism 23 at the end of the measuring distance, the signal 22 is directed towards the receiver 24. Said receiver 24 has a detector of the avalanche diode type for transforming the radiation into an electric signal. The detector is now fed from a supply voltage source 25. The modulating signal from emitter 21 is directed via a connection to the receiver 24 for modulation of the detector.

The signal thus generated from the detector is fed to the evaluation means 27 of the distance measuring instrument through an amplifier 26. The modulation signal from emitter 21 is also fed to the evaluation means 27. The evaluation means 27 can be built up in many different ways and will not be further disclosed here since they are of no importance for the understanding of the invention. However, U.S. Pat. No. 3,488,585 may serve as an example of the design of such circuits.

In filter 28 the control signal is filtered out from the remaining signal and is fed to an amplitude comparative means 29, in which the amplitude of the signal is compared with a preset value from a means 30, for instance, of the same type as that shown in FIG. 1. Depending on this comparison, the controllable voltage source 25 supplies a voltage to the photo avalanche diode 24 so that amplification variatives are independent of temperature variations.

In the FIG. 2 arrangement, a control signal in the form of radiation is not supplied to the photo avalanche diode as in the FIG. 1 arrangement, but instead, the noise from the photo avalanche diode is made use of to provide a control signal. The filter 28 thus filters a certain frequency band of the diode noise. The filtered frequency band must, of course, also in this case, be outside the frequency bands used in means 27, which are thus generated from the emitter 21.

The amplitude of the diode noise varies with the amplification of the diode and the signal from filter 28 may be written $$i_b^2 = k_2 \cdot M^d + k_3$$

where $k_2$, $k_3$ and $d$ are constants and $M$ is the multiplication factor of the avalanche diode.

The system is controlled to keep the signal $i_b$ at a constant level, i.e., $$M^d = \frac{i_b^2 - k_3}{k_2} = \text{constant}$$

In some cases, it might happen that the amplification of the detector should not be kept constant but instead vary in time according to a predetermined program. This will be possible with the method according to the invention if the means that supplies the voltage to be compared with the amplitude of the control signal also supplies a voltage which varies in accordance with the desired frequency variation.

It has been mentioned above that the frequency of the control signal must fall within the range of detection of the detector or within the range of its noise. It may be mentioned here that if the received radiation comprising the distance information in, for instance, an electro-optical distance measuring instrument has, for instance, two different consecutive frequencies, 150 kHz and 15 MHz, a control signal may be chosen with a frequency below, between or above said frequencies. Suitable values for the control signals are 10 kHz or 5 MHz.

Although this invention has been described with respect to its preferred embodiments, it should be understood that many variations and modifications will now be obvious to those skilled in the art, and it is preferred, therefore, that the scope of the invention be limited, not by the specific disclosure herein, but only by the appended claims.

What is claimed is:

1. Apparatus comprising a radiation detecting avalanche diode wherein said diode generates electric signals in dependence upon received radiation, evaluation means for receiving said electric signals, control signal selection means for deriving a control signal from said diode electric signals, said control signal having a frequency differing from the frequency used in said evaluation means, comparison means for comparing the amplitude of said control signal with at least one predetermined value, and supply voltage means for said diode, said supply voltage means being varied in accordance with the output of said comparison means for controlling the amplification of the diode.

2. Apparatus in accordance with claim 1, including a radiation source generating radiation incident upon said diode, said radiation source having constant amplitude and a fixed frequency, said control signal selection means selecting the frequency output signal of said diode resulting from said radiation source as the control signal.

3. Apparatus in accordance with claim 1, wherein said control signal selection means is operative to derive a control signal from the noise signal of said diode.

* * * * *